United States Patent
Bayram et al.

(10) Patent No.: US 9,059,339 B1
(45) Date of Patent: Jun. 16, 2015

(54) LIGHT EMITTING DIODES WITH VIA CONTACT SCHEME

(71) Applicant: International Business Machines Corporation, Armonk, NY (US)

(72) Inventors: Can Bayram, Ossining, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 14/177,344

(22) Filed: Feb. 11, 2014

(51) Int. Cl.
| | | |
|---|---|---|
| H01L 21/00 | (2006.01) | |
| H01L 33/00 | (2010.01) | |
| H01L 33/06 | (2010.01) | |
| H01L 33/32 | (2010.01) | |
| H01L 33/40 | (2010.01) | |
| H01L 33/42 | (2010.01) | |
| H01L 33/38 | (2010.01) | |

(52) U.S. Cl.
CPC ........ *H01L 33/0079* (2013.01); *H01L 33/0025* (2013.01); *H01L 33/06* (2013.01); *H01L 33/32* (2013.01); *H01L 33/405* (2013.01); *H01L 33/42* (2013.01); *H01L 33/0066* (2013.01); *H01L 33/382* (2013.01); *H01L 2933/0016* (2013.01)

(58) Field of Classification Search
CPC ............ H01L 33/0079; H01L 33/0025; H01L 33/0066; H01L 33/06; H01L 33/32; H01L 33/382; H01L 33/405; H01L 33/42
See application file for complete search history.

(56) References Cited

U.S. PATENT DOCUMENTS

| | | |
|---|---|---|
| 5,821,688 A | 10/1998 | Shanks et al. |
| 6,490,402 B1 | 12/2002 | Ota |
| 6,677,918 B2 | 1/2004 | Yuhara et al. |
| 7,705,826 B2 | 4/2010 | Kalt et al. |
| 8,269,314 B2 | 9/2012 | Suzuki et al. |
| 8,376,581 B2 | 2/2013 | Auld et al. |
| 2009/0219225 A1 | 9/2009 | Cope |
| 2011/0273410 A1 | 11/2011 | Park et al. |
| 2011/0304804 A1 | 12/2011 | Lee et al. |
| 2012/0019490 A1 | 1/2012 | Huang |
| 2013/0033488 A1 | 2/2013 | Takahashi et al. |

FOREIGN PATENT DOCUMENTS

| | | |
|---|---|---|
| CN | 102522479 A | 6/2012 |
| JP | 2001272938 A | 10/2001 |

*Primary Examiner* — Stephen W Smoot
*Assistant Examiner* — Vicki B Booker
(74) *Attorney, Agent, or Firm* — Scully, Scott, Murphy & Presser, P.C.; Louis J. Percello, Esq.

(57) ABSTRACT

A method of forming an inorganic light emitting diode (LED) with a via contact scheme for large-area display and backlighting applications is provided. An inorganic LED stack comprising, from bottom to top, a first contact layer, an active layer, and a second contact layer having a polarity different from the first contact layer is removed from the underlying base substrate by a controlled spalling or chemical liftoff process. A via contact scheme that can provide ohmic contacts to both the first contact layer and the second contact layer is then formed on the released LED stack.

20 Claims, 8 Drawing Sheets

LIGHT EMITTING DIODES WITH VIA CONTACT SCHEME

BACKGROUND

The present disclosure relates to semiconductor device manufacturing, and more particularly, to a method of forming an inorganic light emitting diode (LED) with a via contact scheme for large-area display and backlighting applications.

Display devices represent a central component of nearly all consumer electronic technologies. Current large-area displays typically employ organic light emitting diodes (OLEDs) as large-area components and inorganic LEDs as side discrete components. Presently, no technologies can offer a full screen-size backlighting or display based on inorganic LEDs. Since the lifetime and efficiency of currently existing OLEDs are far below those of the inorganic LEDs, there is a need to provide a method for making large-area thin film inorganic LEDs that can be processed later into a large-area one-piece backlighting or display.

SUMMARY

The present disclosure provides a method of forming an inorganic light emitting diode (LED) with a via contact scheme for large-area display and backlighting applications. An inorganic LED stack comprising, from bottom to top, a first contact layer, an active layer, and a second contact layer having a polarity different from the first contact layer is removed from an underlying base substrate by a controlled spalling or chemical liftoff process. A via contact scheme that can provide ohmic contacts to both the first contact layer and the second contact layer is then formed on the released LED stack.

In one aspect of the present disclosure, a method for forming a semiconductor structure is provided. The method of the present disclosure includes first removing, from a base substrate, a light-emitting diode (LED) stack originally grown thereupon to provide a released LED stack with an exposed surface. The LED stack includes from bottom to top, a first contact layer, an active layer, and a second contact layer having a polarity different from the first contact layer. Next a first electrically conductive layer is formed on the exposed surface of the released LED stack. After attaching the released LED stack to a support substrate from the first conductive layer side, a second electrically conductive layer is formed on an uppermost surface of the released LED stack opposite to the exposed surface. A first opening through the second electrically conductive layer, the second contact layer, the active layer and partially through the first contact layer is then formed. The first opening exposes a surface of the first contact layer beneath the uppermost surface of the first contact layer at a bottom of the first opening. Next, a passivation layer is formed atop remaining portions of the second conductive layer, sidewalls of the opening, and the surface of the first contact layer at the bottom of the first opening. Portions of horizontal portions of the passivation layer are then removed to form a second opening and to re-expose the surface of the first contact layer at the bottom of the first opening. The second opening exposes a portion of an uppermost surface of the remaining portions of the second conductive layer. Next, the first opening is filled substantially with a first contact metal and the second opening is filled substantially with a second contact metal.

DETAILED DESCRIPTION

Figure 1:
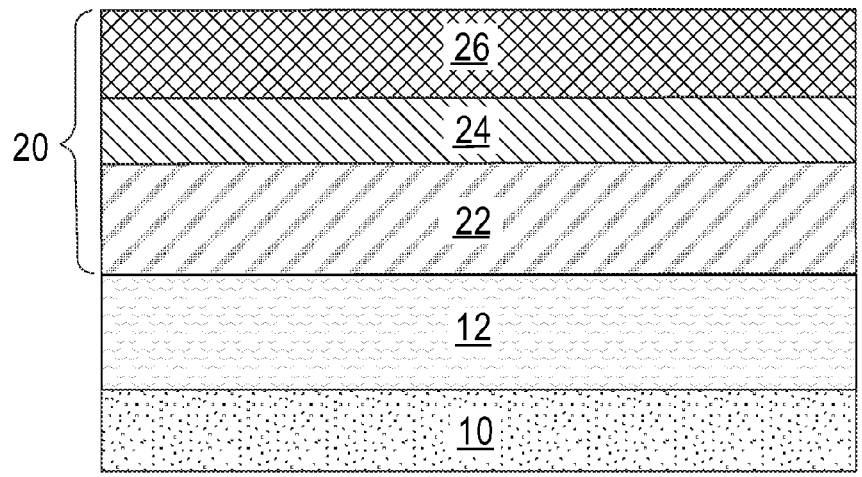
FIG. 1 is a cross-sectional view of an exemplary semiconductor structure that includes a buffer layer and a LED stack located on a base substrate in accordance with an embodiment of the present disclosure.

The present disclosure will now be described in greater detail by referring to the following discussion and drawings that accompany the present disclosure. It is noted that the drawings of the present disclosure are provided for illustrative purposes and, as such, they are not drawn to scale. In the drawings and description that follows, like elements are described and referred to by like reference numerals.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring to FIG. 1, there is illustrated an exemplary semiconductor structure according to an embodiment of the present disclosure that includes a buffer layer 12 and a LED stack 20 located on a base substrate 10. As is shown in the embodiment depicted in FIG. 1, a bottommost surface of buffer layer 12 directly contacts an uppermost surface of base substrate 10 and a bottommost surface of the LED stack directly contacts an uppermost surface of buffer layer 12.

In some embodiments of the present disclosure and as shown in FIG. 1, the base substrate 10 can comprise a semiconductor material including for example, silicon, silicon carbide, gallium arsenide, a Group III nitride material, or a multilayered stack thereof. For example, the base substrate 10 can comprise a multilayered stack of, from bottom to top, a layer of silicon and an epitaxially grown Group III nitride. The term "Group III nitride" as used throughout the present disclosure denotes a compound of nitrogen and at least one element from Group III, i.e., aluminum (Al), gallium (Ga) and indium (In), of the Periodic Table of Elements. Some examples of Group III nitride materials that can be employed as the base substrate 10 include, but are not limited to, GaN, AlN, AlGaN, GaAlN, and GaAlInN. In other embodiments of the present disclosure, the substrate base 10 can comprise an electrically nonconductive material, such as sapphire, i.e., $Al_2O_3$.

The base substrate 10 can have a thickness from 5 µm to 2 cm, although lesser and greater thickness can also be employed.

As is also shown in FIG. 1, the buffer layer 12 can be optionally formed on a surface of the base substrate 10 to reduce the lattice or thermal mismatch between the base substrate 10 and the epitaxial semiconductor layers in the LED stack 20. As shown, the buffer layer 12 is a contiguous layer that is present on an entire surface of the base substrate 10. In some embodiments, especially, when gallium nitride itself is used as the base substrate 10, the step of forming the buffer layer 12 can be eliminated.

The buffer layer 12 that can be formed at this point of the present disclosure is any Group III nitride material which varies depending on the type of the base substrate material on which the LED stack 20 will be subsequently formed. For example, and when the base substrate 10 is composed of silicon, the buffer layer 12 is typically comprised of AlN. When the base substrate 10 is comprised of either sapphire or SiC, the buffer layer 12 can be comprised of AlN, GaN, or AlGaN.

The buffer layer 12 can be formed by introducing an organo-Group III element containing precursor such as, for example, an organoaluminum precursor (i.e., a trialkylaluminum compound), or an organogallium precursor (i.e., a trialkylgallium compound) or a mixture thereof, and a nitride precursor such as, for example, ammonium nitride into a reactor chamber of a metalorganic chemical vapor deposition (MOCVD) apparatus. MOCVD may be carried out with or without a plasma enhancement provision. An inert carrier gas may be present with one of the precursors used in forming the buffer layer 12, or an inert carrier gas can be present with both the precursors used in forming the buffer layer 12. The buffer layer 12 is typically formed at a temperature of 500° C. or greater. In one embodiment, the deposition of the buffer layer 12 typically occurs at a temperature from 650° C. to 850° C. In another embodiment, the deposition of the buffer layer 12 typically occurs at a temperature from 850° C. to 1050° C. Notwithstanding the temperature in which the buffer layer 12 is formed, the deposition of the buffer layer 12 is performed for a time period of 1 minute to 20 minutes. The buffer layer 12 that is formed typically has a thickness from 10 nm to 250 nm, with a thickness from 60 nm to 80 nm being even more typical.

Next, the LED stack 20 including, from bottom to top, an n-contact layer 22, an active layer 24 and a p-contact layer 26 is formed on, when present, the buffer layer 12. Under a forward bias, the p-contact layer 26 injects holes and n-contact layer 22 injects electrons. The holes and electrons recombine in the active layer 24 to emit light. Although a LED stack 20 with an n-contact layer 22 formed on the buffer layer 12 is described and illustrated in FIG. 1, the method of the present disclosure works equally well when the polarity of the LED stack 20 is reversed, in which a p-contact layer is formed on the buffer layer, followed by an active layer and an n-contact layer (not shown).

The n-contact layer 22 may be any semiconductor material doped with n-type dopants. In some embodiments, the n-contact layer 22 can be a Group III nitride based material, such as GaN, InGaN, AlGaN, or InAlGaN, doped with n-type dopants. The n-type dopants can include but are not limited to, silicon (Si), phosphorus (P), arsenic (As), and antimony (Sb). The doping level of n-type dopants may range from $1 \times 10^{16}$ to $1 \times 10^{20}$ atoms/cm$^3$. In one embodiment, the n-contact layer 22 is a Si doped n-GaN layer.

The active layer 24 is then disposed on the n-contact layer 22. The active layer 24 can be a single light emitting layer, or a multiple quantum well (MQW) structure including multiple light emitting layers separated by barrier layers (not shown). The active layer 24 may be composed of any Group III nitride based material, such as, but not limited to, InGaN or GaN. The active layer 24 may be grown by any method known in the art, including a MOCVD or a hydride/halide vapor phase epitaxy (HVPE). In one embodiment, the active layer 24 is composed of InGaN quantum wells separated by n-GaN.

Next, the p-contact layer 26 is disposed on the active layer 24. The p-contact layer 26 may be any semiconductor material doped with p-type dopants. In some embodiments of the present disclosure, the p-contact layer 26 can be composed of a Group III nitride based material, such as GaN, InGaN, or AlGaN, doped with p-type dopants. The p-type dopants can include, but are not limited to, magnesium (Mg), boron (B), Al, and In. The desired doping level of the p-type dopants may range from $1 \times 10^{18}$ to $1 \times 10^{20}$ atoms/cm$^3$. In one embodiment, the p-contact layer 26 is a magnesium doped p-GaN layer.

The n-contact layer 22 and the p-contact layer 26 can be formed utilizing an epitaxial growth process in which an undoped or in-situ doped semiconductor material is formed. Doping can be introduced after epitaxial growth (ex-situ) utilizing ion implantation, gas phase doping or dopant out diffusion from a sacrificial dopant source material. In one embodiment, the n-contact layer 24 can be grown by the MOCVD or HVPE process using $SiH_4$ and/or $Si_2H_6$ as the Si dopant source. The p-contact layers 26 can also be gown by the MOCVD or HVPE process. In one embodiment, incorporation of Mg during the growth of the p-contact layers 26 may be by way of introduction of, for example, an organometallic precursor, for example, Bis (cyclopentadienyl) magnesium ($Cp_2Mg$) to the epitaxy chamber.

After growth of epitaxial layers (22, 24, 26) in the LED stack 20, the structure of FIG. 1 is annealed in an inert atmosphere to activate the dopants in the p-contact layer 26. The anneal may be performed at a temperature from 800° C. to 1100° C. The anneal may be performed in an inert ambient. Alternatively, the anneal may be performed in a forming gas ambient.

The total thickness of LED stack 20 may be from 2 µm to 5 µm, although lesser and greater thickness can also be employed.

Figure 2:
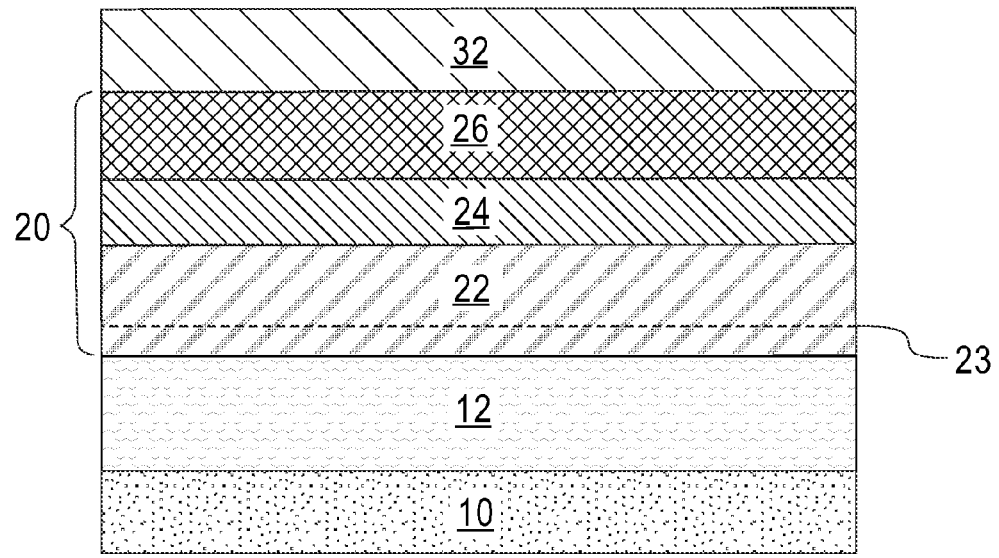
FIG. 2 is a cross-sectional view of the structure of FIG. 1 after forming a stressor layer on an uppermost surface of the LED stack.

Referring to FIG. 2, there is illustrated the structure of FIG. 1 after forming a stressor layer 32 on an uppermost surface of the LED stack 20. The stressor layer 32 that can be employed in the present disclosure includes any material that is under tensile stress on the LED stack 20 (22, 24 and 26) after deposition. The stressor layer 32 has a critical thickness and a stress value that will cause spalling mode fracture to occur at an intended spalling plane 23 within the n-contact layer 22. By "critical" it is meant that for a given combination of the stressor material and n-contact layer 22, a thickness value and a stressor value for the stressor layer 32 is chosen that render spalling mode fracture possible (can produce a $K_I$ value greater than the $K_{IC}$ of the n-contact layer 22). By "spalling mode fracture" it is meant that a crack is formed within the n-contact layer 22 and the combination of loading forces maintains a crack trajectory at a depth below the uppermost surface of the n-contact layer 22. The stress value can be adjusted by tuning the deposition conditions of the stressor layer 32. For example, in the case of sputter deposition of stressor layer 32, the gas pressure can be used to tune the stress value as described in Thorton and Hoffman, *J. Vac. Sci. Technol.*, 14 (1977) p. 164.

The thickness of the stressor layer 32 is chosen to provide the desired fracture depth in the n-contact layer 22 (i.e., along the intended spalling plane 23). For example, if the stressor layer 32 is chosen to be Ni, then fracture will occur at a depth below the stressor layer 32 roughly 2 to 3 times the Ni thickness.

Examples of such materials that are under tensile stress when applied atop the LED stack 20 and thus can be employed as the stressor layer 32 include, but are not limited to, a metal, a polymer, such as a spall inducing tape layer, or any combination thereof. The stressor layer 32 may comprise a single stressor layer, or a multilayered stressor structure including at least two layers of different stressor materials.

In one embodiment, the stressor layer 32 is a metal, and the metal is formed on the uppermost surface of the LED stack 20. In another embodiment, the stressor layer 32 is a spall inducing tape, and the spall inducing tape is applied directly to the uppermost surface of the LED stack 20. In another embodiment, for example, the stressor layer 32 may comprise a two-part stressor layer including a lower part and an upper part. The upper part of the two-part stressor layer can be comprised of a spall inducing tape layer.

When a metal is employed as the stressor layer 32, the metal can include, for example, Ni, Cr, Fe, Mo, Ti, and W. Alloys of these metals can also be employed. In one embodiment, the stressor layer 32 includes at least one layer consisting of Ni.

When a polymer is employed as the stressor layer 32, the polymer can include, for example, polyimides polyesters, polyolefins, polyacrylates, polyurethane, polyvinyl acetate, and polyvinyl chloride.

When a spall inducing non-metallic layer (i.e. polymeric materials such as a tape) is employed as the stressor layer 32, the spall inducing layer includes any pressure sensitive tape that is flexible, soft, and stress free at a first temperature used to form the tape, yet strong, ductile and tensile at a second temperature used during removal, i.e., spalling, of a portion the n-contact layer 22. By "pressure sensitive tape," it is meant an adhesive tape that will stick with application of pressure, without the need for solvent, heat, or water for activation. Tensile stress in the tape at the second temperature is primarily due to thermal expansion mismatch between the materials of the multilayered stack (with a lower thermal coefficient of expansion) and the tape (with a higher thermal expansion coefficient).

Typically, the pressure sensitive tape that is employed in the present disclosure as stressor layer 32 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 32 employed in the present disclosure is formed at room temperature (15° C.-40° C.). In another embodiment, when a tape layer is employed, the tape layer can be formed at a temperature from 15° C. to 60° C.

When the stressor layer 32 is a metal or polymer, the stressor layer 32 can be formed utilizing deposition techniques that are well known to those skilled in the art including, for example, dip coating, spin-coating, brush coating, sputtering, chemical vapor deposition (CVD), plasma enhanced chemical vapor deposition (PECVD), chemical solution deposition, physical vapor deposition (PVD), or plating.

When the stressor layer 32 is a spall inducing tape layer, the tape layer can be applied by hand or by mechanical means to the structure. The spall inducing tape can be formed utilizing techniques well known in the art or they can be commercially purchased from any well-known adhesive tape manufacturer. Some examples of spall inducing tapes that can be used in the present disclosure as the stressor layer 32 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the uppermost surface of the LED stack 20, wherein a lower part of the two-part stressor layer is formed at a first temperature which is at room temperature or slight above (e.g., from 15° C. to 60° C.), wherein an upper part of the two-part stressor layer comprises a spall inducing tape layer at an auxiliary temperature which is at room temperature.

If the stressor layer 32 is of a metallic nature, it typically has a thickness of from 1 µm to 50 µm, with a thickness of from 4 µm to 7 µm being more typical, although lesser and greater thickness can also be employed.

If the stressor layer 32 is of a polymeric nature, it typically has a thickness of from 10 µm to 200 µm, with a thickness of from 50 µm to 100 µm being more typical. Other thicknesses for the stressor layer 32 that are below and/or above the aforementioned thickness ranges can also be employed in the present disclosure.

An optional metal-containing adhesion layer (not shown) may be formed atop the uppermost surface of the LED stack 20 before forming the stressor layer 32 in embodiments in which the stressor layer 32 has poor adhesion to the uppermost surface of the LED stack 20. Typically, the metal-containing adhesion layer is employed when a stressor layer 32 comprised of a metal is employed. In some embodiments, an optional plating seed layer (not shown) can be formed directly atop the uppermost surface of the LED stack 20. The optional plating seed layer can be used together with the metal-containing adhesion layer or in lieu thereof.

The optional metal-containing adhesion layer that can be employed in the present disclosure includes any metal adhesion material such as, but not limited to, Ti/W, Ti, Cr, Ni or any combination thereof. The optional metal-containing adhesion layer may comprise a single layer or it may include a multi-layered structure comprising at least two layers of different metal adhesion materials.

The optional metal-containing adhesion layer can be formed utilizing deposition techniques that are well known to those skilled in the art. For example, the optional metal-containing adhesion layer can be formed by sputtering, CVD, PECVD, chemical solution deposition, PVD, or plating. When sputter deposition is employed, the sputter deposition process may further include an in-situ sputter clean process before the deposition.

When employed, the optional metal-containing adhesion layer typically has a thickness from 5 nm to 300 nm, with a thickness from 100 nm to 150 nm being more typical, although lesser and greater thickness can also be employed.

The optional plating seed layer (not shown) is typically employed in embodiments in which the stressor layer to be subsequently formed is a metal and plating is used to form the metal-containing stressor layer. The optional plating seed layer is employed to selectively promote subsequent plating of a pre-selected metal-containing stressor layer. The optional plating seed layer may comprise, for example, a single layer of Ni or a layered structure of two or more metals such as Ti/Ni, Ti/Ag, Ti/Au, Cr/Ni, Cr/Ag, Cr/Au, Al(bottom)/Ti/Ni (top), etc. The thickness of the optional plating seed layer may vary depending on the material or materials of the optional plating seed layer as well as the technique used in forming the same. Typically, the optional plating seed layer has a thickness from 2 nm to 1 µm. The optional plating seed layer can be formed by a conventional deposition process including, for example, CVD, PECVD, atomic layer deposition (ALD), or PVD techniques that may include evaporation and/or sputtering.

In accordance with the present disclosure, the optional metal-containing adhesion layer and/or the optional plating seed layer is (are) formed at a temperature which does not effectuate spontaneous spalling to occur within the LED stack 20. By "spontaneous" it is meant that the removal of a thin material layer from a base substrate occurs without the need to employ any manual means to initiate crack formation and propagation for breaking apart the thin material layers from the base substrate. By "manual" it is meant that crack formation and propagation are explicit for breaking apart the thin material layers from the base substrate.

Figure 3:
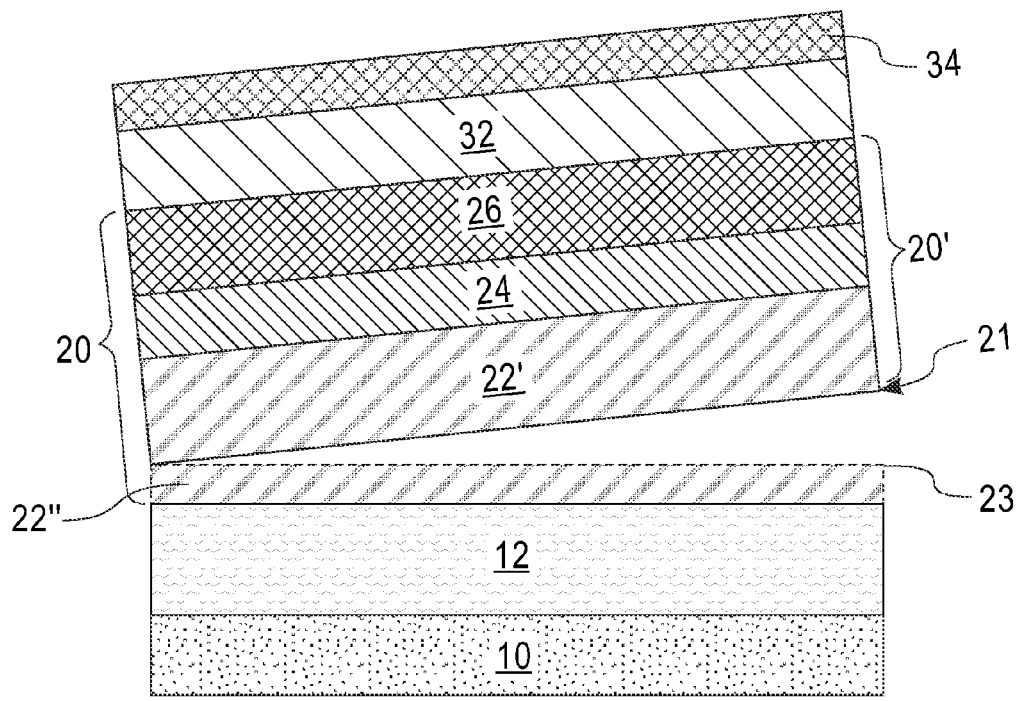
FIG. 3 is a cross-sectional view of the structure of FIG. 2 after removing a portion of the LED stack by a controlled spalling process along a spalling plane within an n-contact layer of the LED stack.

Referring to FIG. 3, there is illustrated the structure of FIG. 2 after removing a portion of the LED stack 20 by a controlled spalling process along the intended spalling plane 23 within the n-contact layer 22. The remaining portion of the LED stack 20 after the controlled spalling process is herein referred to as spalled LED stack 20'. The upper portion of the n-contact layer that remains in the spalled LED stack 20' is herein referred to as spalled n-contact layer 22'. A lower portion of the n-contact layer 22 that is on the substrate 10 or when present on the buffer layer 12 is herein referred to as unspalled n-contact portion 22".

As shown in FIG. 3, during the controlled spalling process, a handle layer 34 is typically formed atop the stressor layer 32. The handle layer 34 employed in the present disclosure comprises any flexible material which has a minimum radius of curvature of less than 30 cm such that the handle layer 34 is not too rigid to compromise the spalling process. Examples of the flexible materials that can be employed as the handle layer 34 include a metal foil and a polyimide film. In some embodiments, a tape, as described above, can be used as the handle layer 34.

The handle layer 34 can be used to provide better fracture control and more versatility in handling the spalled n-contact layer 22'. Moreover, the handle layer 34 can be used to guide the crack propagation along the intended spalling plane 23 within the n-contact layer 22 during the spalling process of the present disclosure. The handle layer 34 is typically formed at a temperature from 15° C.-40° C.

The handle layer 34 can be formed utilizing deposition techniques that are well known to those skilled in the art including, for example, mechanical pressure, dip coating, spin-coating, brush coating, sputtering, CVD, PECVD, chemical solution deposition, PVD, and plating.

The handle layer 34 typically has a thickness of from 5 µm to 500 µm, with a thickness of from 10 µm to 150 µm being more typical, although lesser and greater thickness can also be employed.

In one embodiment of the present disclosure, the spalling process includes pulling or peeling the handle layer 34 to remove a spalled structure that includes the stressor layer 32 and a portion of the LED stack 20. After the controlled spalling process, a bottommost surface now formed in the spalled LED stack 20' is herein referred to as bottommost surface 21.

The spalling process includes crack formation and propagation along the intended spalling plane 23 within the n-contact layer 22 of the LED stack 20. In some embodiments of the present disclosure, the spalling process is initiated at substantially room temperature (i.e., 15° C. to 40° C.). In other embodiments, the spalling can be performed at a temperature from 100° C. and below. In some embodiments of the present disclosure, the spalling can be initiated by lowering the temperature at a fixed continuous rate. By "fixed continuous rate" it is mean, for example, 20° C. per second utilizing an electronically controlled cooling table or chamber.

Other techniques known to those skilled in the art may be employed to remove the LED stack 20 from the underlying buffer layer 12, when present, and the substrate 10. For example, and in one embodiment, a chemical liftoff process can be used in which the structure of the present disclosure is immersed into an etchant. A sacrificial layer (not shown) between the n-contact layer 22 and the buffer layer 12 is preferentially etched and subsequently releases the overlying LED stack 20. The sacrificial layer can be composed of GaN:Si, CrN or ZnO. In some embodiments of the present disclosure, photoelectrochemical (PCE) etching techniques may also be employed. In one embodiment, and when the sacrificial layer is composed of ZnO, a HCl solution may be employed as the etchant.

Figure 4A:
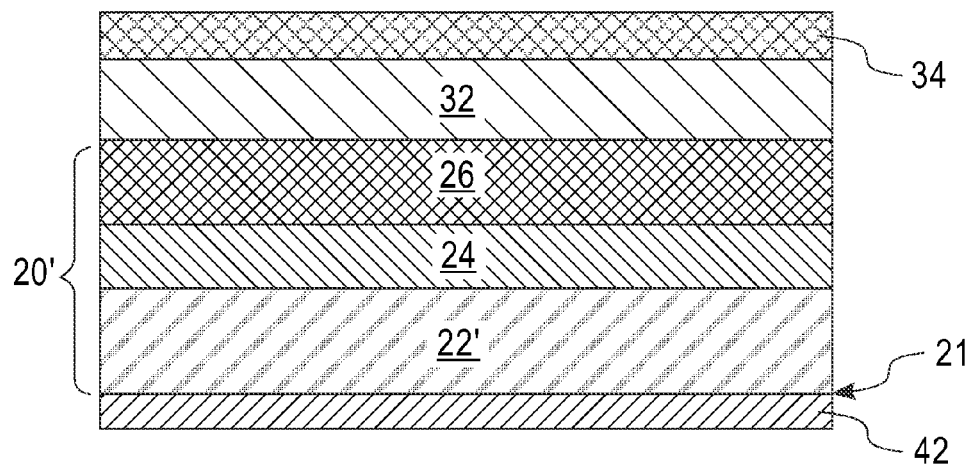
FIG. 4A is a cross-sectional view of the structure of FIG. 3 after forming a conductive spreading layer on the spalled n-contact layer in accordance with one embodiment of the present disclosure.
Figure 4B:
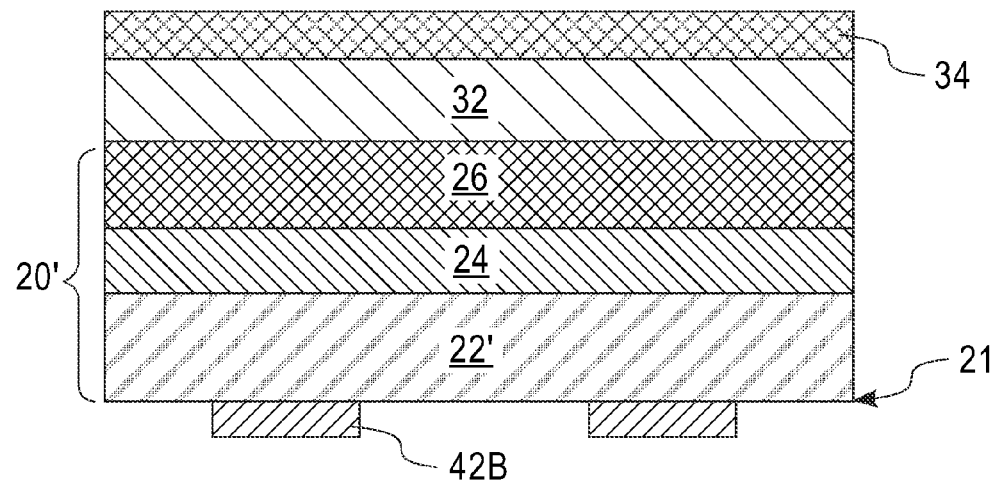
FIG. 4B is a cross-sectional view of the structure of FIG. 3 after forming a conductive spreading structure with a patterned structure on the spalled n-contact layer in accordance with another embodiment of the present disclosure.

Referring to FIGS. 4A-4B, there is illustrated the structure of FIG. 3 after forming a conductive spreading layer 42 on the spalled n-contact layer 22'. As shown in FIG. 4A, the conductive spreading layer is disposed on the now formed bottommost surface 21 of the spalled LED stack 20'. The conductive spreading layer 42 may be formed of a transparent conductive material. Exemplary conductive materials that can be employed in the present disclosure as the conductive spreading layer 42 include metals or highly doped semiconductor materials of the same doping type as the contact layer. In some embodiments, the conductive spreading layer 42 is composed of ITO or ZnO. The conductive spreading layer 42 may comprise a single layer or it may include a multilayered structure. In some embodiments, the conductive spreading layer 42 is a bilayer structure comprising a 3 nm-thick Ti layer and a 3 nm-thick Au layer. Various techniques, such as CVD, PVD, and PECVD, can be employed to form the conductive spreading layer 42. The conductive spreading layer 42 typically has a thickness from 1 nm to 50 nm. A thicker conductive spreading layer 42 can be used when a transparent conductor such as ITO is used. The conductive spreading layer 42 can be a contiguous film that spans the entirety of the bottommost surface 21 as shown in FIG. 4A or a patterned structure 42B as shown in FIG. 4B. Conventional techniques, such as photolithography and etching, can be used to pattern the conductive spreading layer 42. Patterning techniques using a stamp may also be used. In one embodiment, the patterned structure 42B can be formed by first forming a photoresist (not shown) on a surface of the conductive spreading layer 42. The photoresist is then patterned by lithographic exposure and development. The pattern in the photoresist is transferred into the conductive spreading layer 42 by an etch, which can be an anisotropic etch such as a reactive ion etch.

Figure 5:
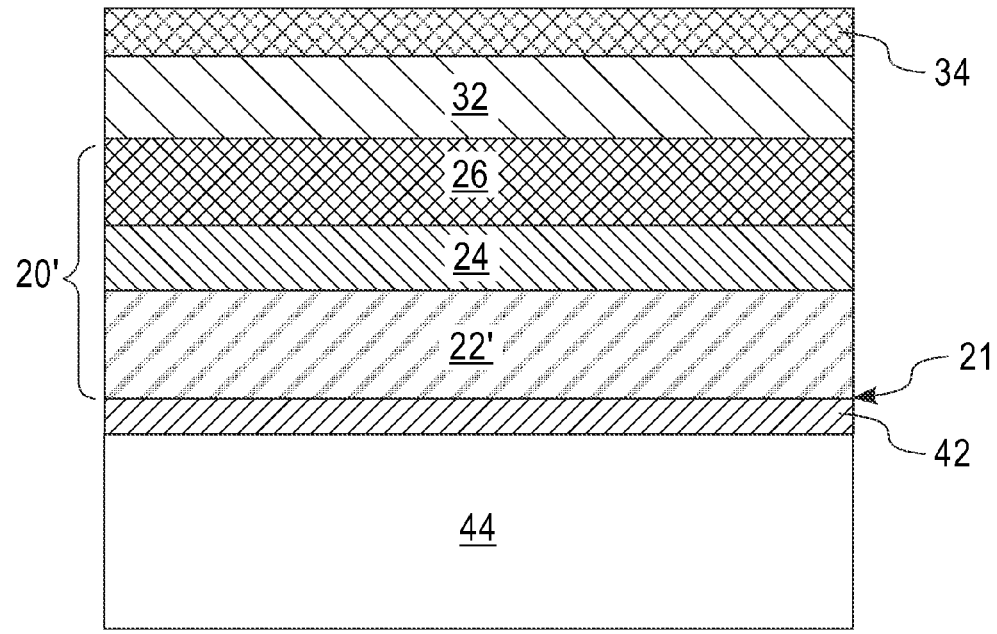
FIG. 5 is a cross-sectional view of the structure of FIG. 4A after attaching the spalled LED stack to a support substrate from the conductive spreading layer side.

Referring to FIG. 5, there is illustrated the structure of FIG. 4A after transferring the spalled LED stack 20' to a support substrate 44. Although the structure shown in FIG. 4A is specifically illustrated herein, the structure shown in FIG. 4B can also be transferred to a support substrate. The transferring may be performed utilizing a conventional bonding process as is well known to those skilled in the art. The spalled LED stack 20' can be bonded to the support substrate 44 from the conductive spreading layer 42 side by a bonding agent, for example, a conductive silver-filled epoxy. In some embodiments of the present disclosure, the support substrate 44 can comprise a transparent material, such as transparent glass or plastic, dependent upon the mechanical strength requirements and the expected end applications. Various commercially available plastic films can be used to serve as the support substrate 44 for forming a flexible device. Exemplary plastic films include, but not limited to, transparent poly (ethylene terephthalate) (PET), poly(butylene terephthalate) (PBT), poly(enthylene naphthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS), and poly(methyl methyleacrylate) (PMMA). In other embodiments, the support substrate 44 can be a more complex stack composed of a flexible transparent surface, a transparent conductive layer, LCD display layers, or non-conductive separator dots on a glass substrate.

Figure 6:
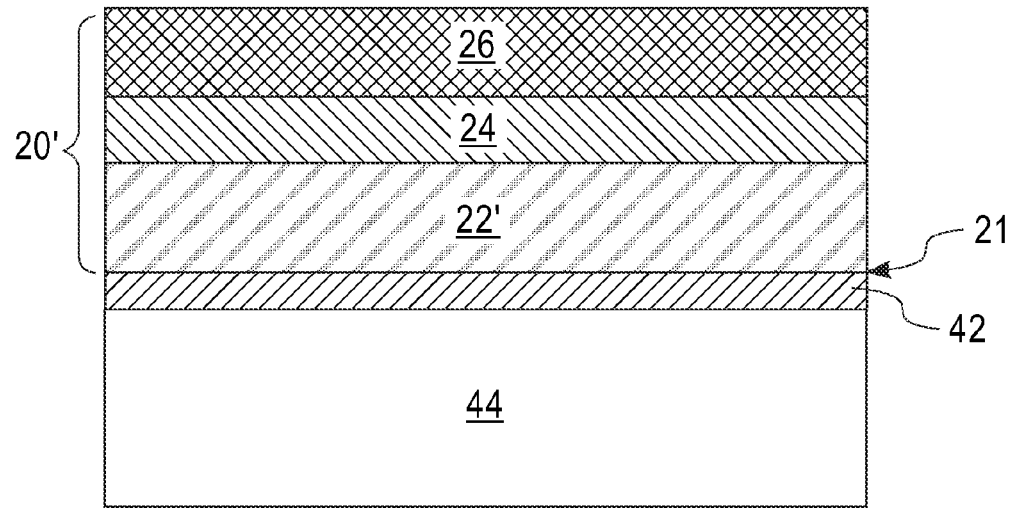
FIG. 6 is a cross-sectional view of the structure of FIG. 5 after removing the handle layer and the stressor layer.

Referring to FIG. 6, there is illustrated the structure of FIG. 5 after removing the handle layer 34, the stressor layer 32, and when present, the optional plating seed layer and the optional metal-containing adhesion layer. The handle layer 34, the stressor layer 32, and when present, the optional plating seed layer and the optional metal-containing adhesion layer can be removed utilizing conventional techniques well known to those skilled in the art. For example, and in one embodiment, aqua regia ($HNO_3/HCl$) can be used for removing the handle layer 34, the stressor layer 32, and when present the optional plating seed layer and the optional metal-containing adhesion layer. In another embodiment, UV or heat treatment is used to remove the handle layer 34 followed by a chemical etch to remove the stressor layer 32, followed by a different chemical etch to remove the optional plating seed layer, and the optional metal-containing adhesion layer.

Figure 7:
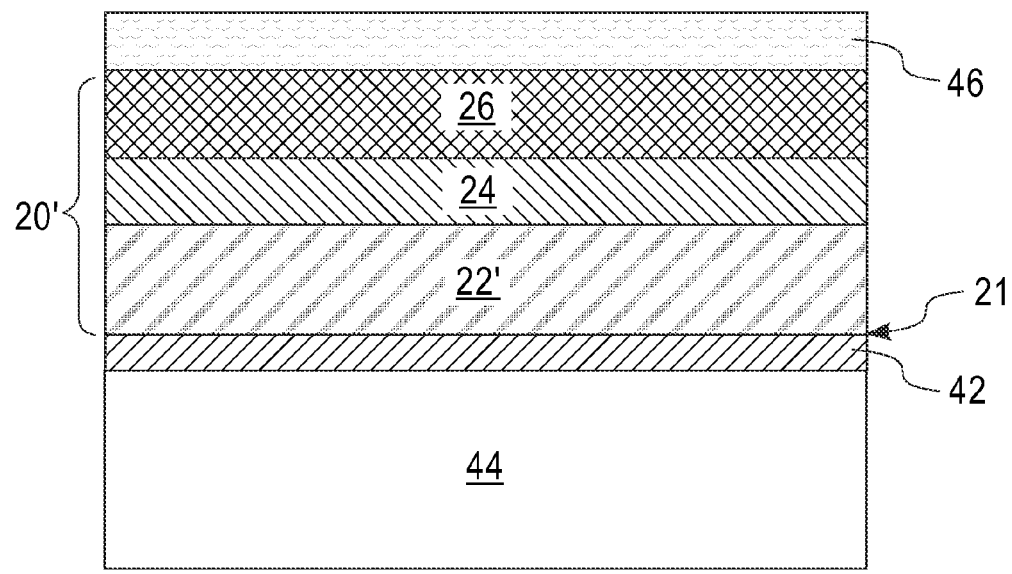
FIG. 7 is a cross-sectional view the structure of FIG. 6 after forming an ohmic contact layer on the p-contact layer.

Referring to FIG. 7, there is illustrated the structure of FIG. 6 after forming a blanket layer of ohmic contact layer 46 on the p-contact layer 26. The ohmic contact layer 46 is typically, but not necessarily always, formed by depositing ohmic contact metals in dots, and then annealing. Other techniques that can be use in forming the ohmic contact layer include any well known deposition process such as, for example, electron beam evaporation. To provide ohmic contact to a p-type GaN material system, the ohmic contact layer 46 can be composed of Au, Ni, Pt, Pd, Ti, W, Cr/Au, Ni/Au, Au/NiO, Pt/Au, Pd/Au, Co/Au, Cu/Au, Ni/Pt, Ni/Au/Zn, Cr/Au/Zn, Ni/Cr/Au, Ni/Pt/Au, Pt/Ni/Au, Pd/Pt/Au, or Ti/Al/Ni/Au. In one embodiment of the present disclosure, and when the p-contact layer is a Si doped p-type GaN, the ohmic contact layer 46 is composed of Ni/Au. The ohmic contact layer 46 can have a thickness from 6 nm to 40 nm, although lesser and greater thickness can also be employed.

Figure 8:
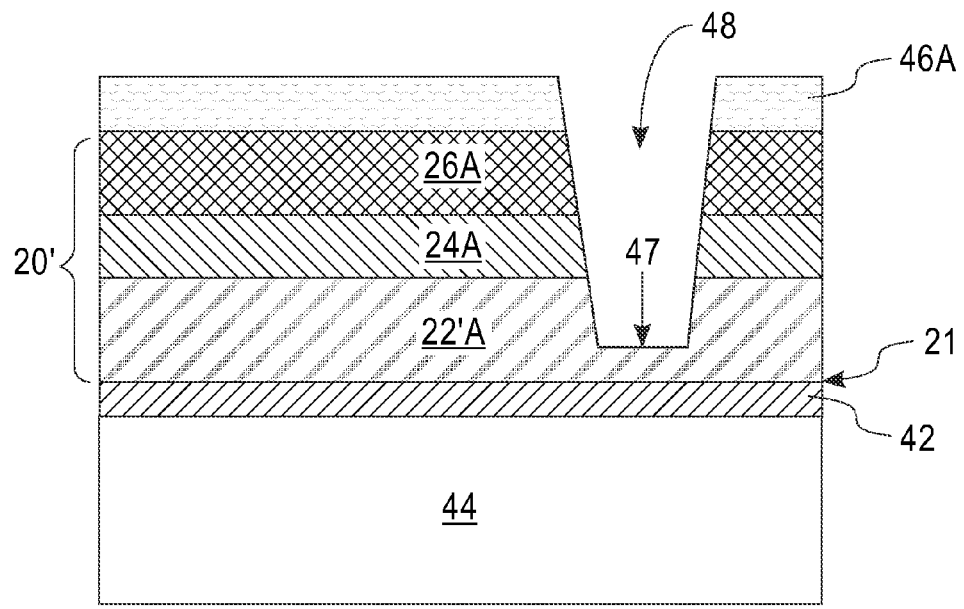
FIG. 8 is a cross-sectional view of the structure of FIG. 7 after forming a first opening through the ohmic contact layer, the p-contact layer, the active layer and partially through the spalled n-contact layer exposing a surface of the spalled n-contact layer which is located beneath the uppermost surface of the spalled n-contact layer.

Referring to FIG. 8, there is illustrated the structure of FIG. 7 after forming an opening 48 through the ohmic contact layer 46, the p-contact layer 26, the active layer 24 and partially through the spalled n-contact layer 22'. The opening 48 exposes a surface 47 of the partially etched spalled n-contact layer 22' which is located beneath the uppermost surface of the original spalled n-contact layer 22'. The opening 48 also exposes sidewalls of remaining portions of the ohmic contact layer 46, the p-contact layer 26, the active layer 24 and the partially etched spalled n-contact layer 22'. The remaining portions of the ohmic contact layer 46, the remaining portions of the p-contact layer 26, the remaining portions of the active layer 24 and the remaining portions of the spalled n-contact 22' are herein referred to as 46A, 26A, 24A and 22'A, respectively.

The opening 48 can be formed by lithography and etching. The lithographic step used in forming the opening 48 can include applying a blanket layer of a photoresist material on an uppermost surface of the ohmic contact layer 46, exposing the photoresist material to radiation developing the exposed photoresist material. The etching step used in forming the opening 48 may include a dry etching process, such as reactive ion etching (RIE), plasma etching, and ion beam etching. In one embodiment, when RIE etching is used, the incident angle of the ion beam is set to be less than 90° relative to a normal to the uppermost surface of the ohmic contact layer 46. The incident angle typically is between 60° and 70°. After the etching process has been performed, the patterned photoresist materials can be stripped from the structure utilizing a conventional resist stripping process such, for example, ashing.

Figure 9:
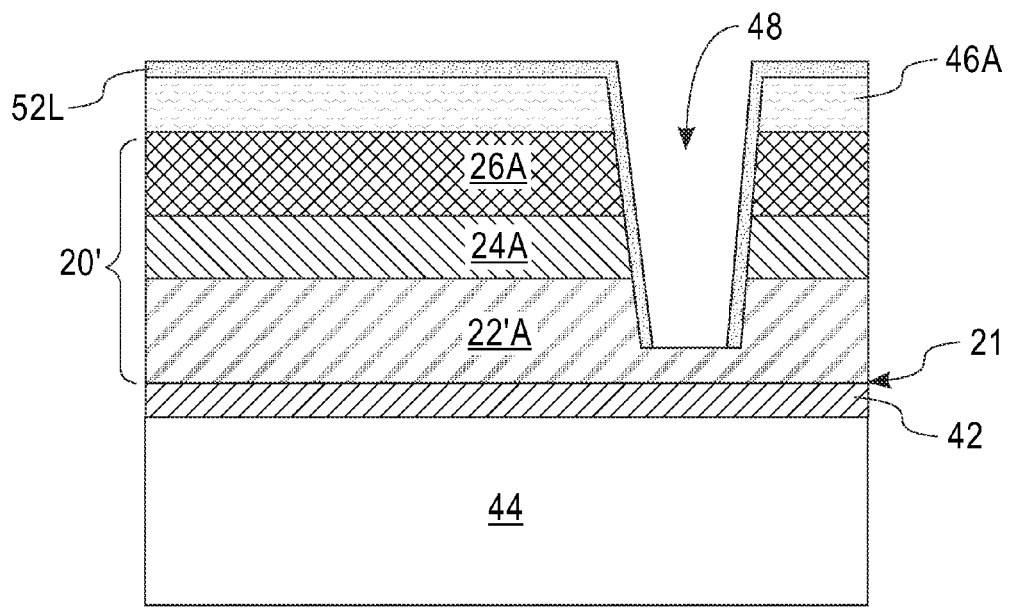
FIG. 9 is a cross-sectional view of the structure of FIG. 8 after forming a passivation layer on horizontal portions of remaining portions of the ohmic contact layer and along sidewalls and a bottom surface of the opening.

Referring to FIG. 9, there is illustrated the structure of FIG. 8 after forming a passivation layer 52L on all exposed surfaces of the structure. Specifically, the passivation layer 52L is formed on the exposed uppermost surface of the remaining portions of the ohmic contact layer 26A and along the contour of the opening 48, including the exposed sidewalls of the remaining portions of the ohmic contact layer 46A, the remaining portions of the p-contact layer 26A, the remaining portions of the active layer 24A and the remaining portions of the spalled n-contact layer 22'A as well as the exposed surface 47 of the remaining portions of the spalled n-contact layer 22'A.

The passivation layer 52L may comprise a dielectric oxide, a dielectric nitride, or a metal oxide. In one embodiment of the present disclosure, the passivation layer 52L comprises a SiN, $SiO_2$ or $Al_2O_3$. The passivation layer 52L can be formed by a deposition process including, for example, CVD, PECVD, ALD, and sputtering. The passivation layer 52L thus obtained typically has a thickness from 100 nm to 500 nm, although lesser and greater thickness can also be employed. For lower power applications and ALD deposition, the passivation layer 52L can be very thin, for example, on the order of a few nanometers. A highly reflective coating (not shown) such as, for example, Ag or a dielectric stack can be integrated with the passivation layer 52L as a light reflector.

Figure 10:
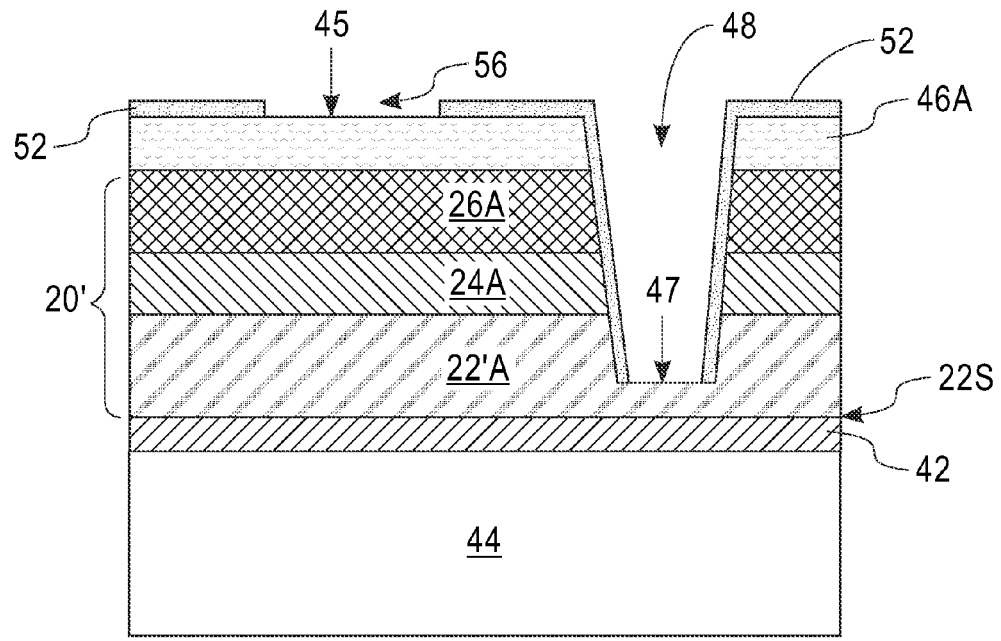
FIG. 10 is a cross-sectional view of the structure of FIG. 9 after removing portions of horizontal portions of the remaining portions of the passivation layer to form a second opening through the passivation layer exposing a portion of an uppermost surface of the remaining portions of the ohmic contact layer and to re-expose the surface of the spalled n-contact layer.

Referring to FIG. 10, there is illustrated the structure of FIG. 9 after removing portions of horizontal portions of the passivation layer 52L to form an opening 56 through the passivation layer 52L and to re-expose the surface 47 of the remaining portions of the spalled n-contact layer 22'A. The opening 56 also exposes a portion of the uppermost surface of the remaining portions of the ohmic contact layer 46A. The remaining portions of the passivation layer 52L is herein referred to as 52. The exposed portion of the uppermost surface of the remaining portions of the ohmic contact layer 46A is herein labeled as element 45.

The removal of portions of the horizontal portions of the passivation layer 52L can be performed utilizing an anisotropic (i.e., directional) etching process such as, for example, RIE.

Figure 11:
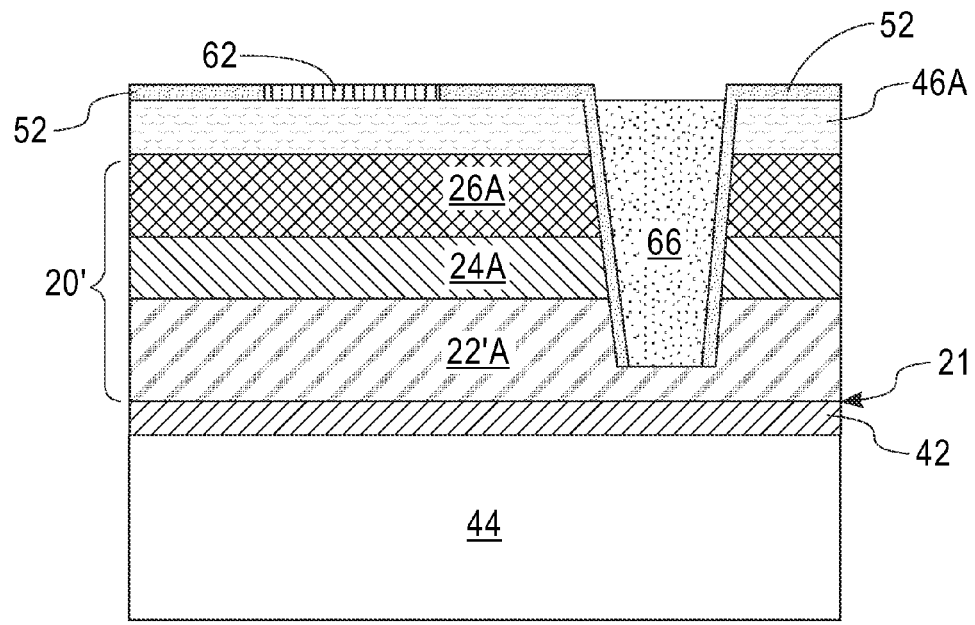
FIG. 11 is a cross-sectional view of the structure of FIG. 10 after filling the first opening with an n-contact metal and filling the second opening with a p-contact metal.

Referring to FIG. 11, there is illustrated the structure of FIG. 10 after forming a p-contact 62 and an n-contact 66. The p-contact 62 is formed by filling the opening 56 with a p-contact metal. The n-contact 66 is formed by filling the opening 48 with an n-contact metal. The p-contact metal and the n-contact metal can be deposited either at the same time or separately depending on the end applications. The p-contact 62 and the n-contact 66 can be formed by E-beam evaporation or photoelectrochemical deposition of the p-contact metal and the n-contact metal, respectively. The openings 48 and 56 are typically filled substantially to ensure proper bonding. Examples of the p-contact metal includes, but not limited to, Ti/Au, Ti/Al and Ti/Ag/Al. Examples of the n-contact metal includes, but not limited to, Ti/Au, Ti/Al/Au and Ti/Ag/Au.

Figure 12:
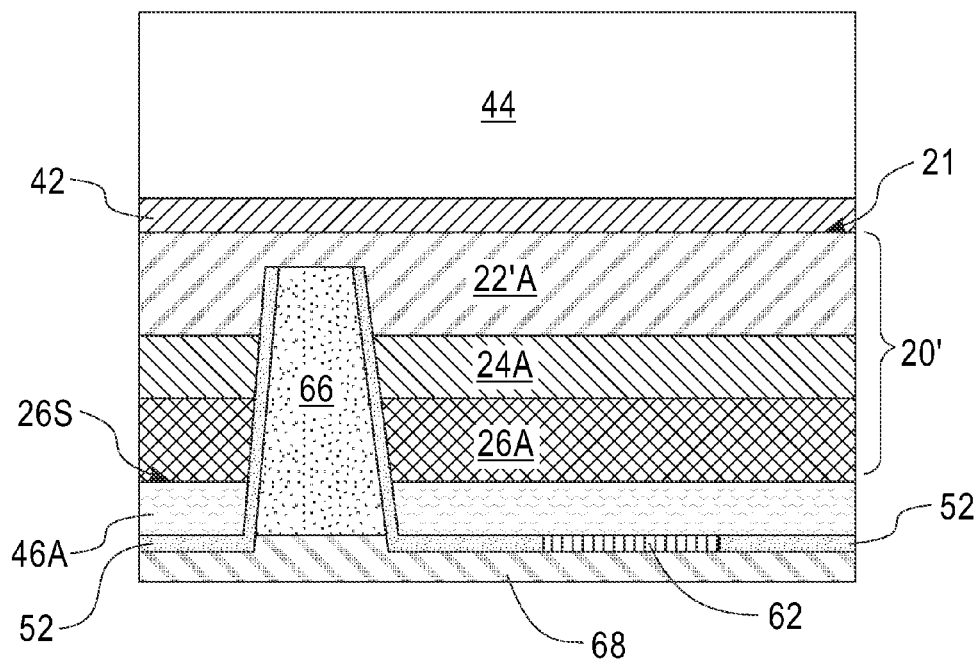
FIG. 12 is a cross-sectional view of the structure of FIG. 11 after forming a protection layer on all exposed surfaces of the structure in accordance with one embodiment of the present disclosure.

Referring to FIG. 12, there is illustrated the structure of FIG. 11 after forming a protection layer 68 onto exposed surfaces of the remaining portions of the passivation layer 52, the p-contact 62 and the n-contact 66 in accordance with one embodiment of the present disclosure. The protection layer 68 is typically composed of a nonconductive material, including, but not limited to, an epoxy or a polymer.

Figure 13:
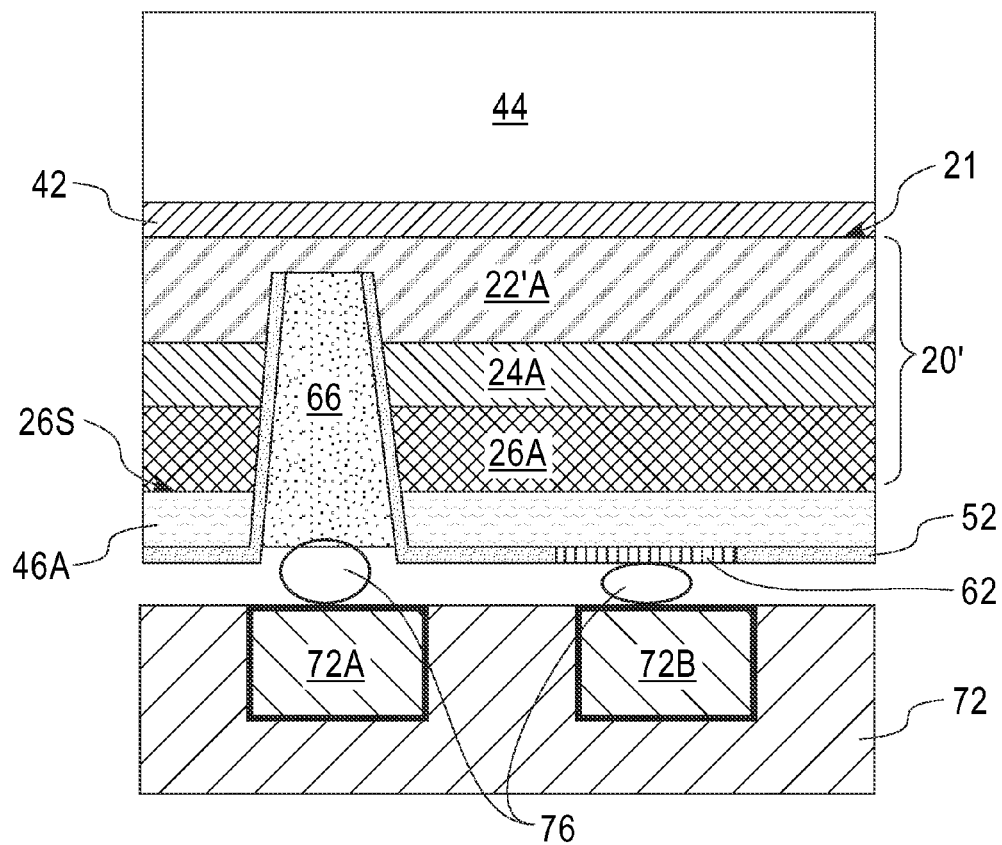
FIG. 13 is a cross sectional view of the structure of FIG. 11 after bonding the structure to a host substrate in accordance with another embodiment of the present disclosure.

Referring to FIG. 13, there is illustrated the structure of FIG. 11 after bonding the structure to a host substrate 72 by indium bumps 76 in accordance with another embodiment of the present disclosure. The host substrate 72 can be composed of a rigid material or a flexible material depending on the end applications. The host substrate 72 includes an n-contact region 72A and a p-contact region 72B to provide better control over the injection voltage and current. The n-contact region 72A and the p-contact region 72B in the host substrate 72 can be formed by ion implantation. In one embodiment of the present disclosure, the indium bumps 76 can be applied over a large area of the host substrate 72. In another embodiment, the indium bumps 76 can be pattered into any shape, for example, squares for display application.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for forming a semiconductor structure, comprising:
   removing, from a base substrate, a light-emitting diode (LED) stack originally grown thereupon to provide a released LED stack with an exposed surface, wherein the LED stack comprises from bottom to top, a first contact layer, an active layer, and a second contact layer having a polarity different from the first contact layer;
   forming a first electrically conductive layer on the exposed surface of the released LED stack;
   attaching the released LED stack to a support substrate from the first conductive layer side;
   forming a second electrically conductive layer on an uppermost surface of the released LED stack opposite to the exposed surface;
   forming a first opening through the second electrically conductive layer, the second contact layer, the active layer and partially through the first contact layer, wherein the first opening exposes a surface of the first contact layer beneath the uppermost surface of the first contact layer at a bottom of the first opening;
   forming a passivation layer atop remaining portions of the second conductive layer, sidewalls of the opening, and the surface of the first contact layer at the bottom of the first opening;
   removing portions of horizontal portions of the passivation layer to form a second opening and to re-expose the surface of the first contact layer at the bottom of the first opening, wherein the second opening exposes a portion of an uppermost surface of the remaining portions of the second conductive layer; and
   filling the first opening substantially with a first contact metal and filling the second opening substantially with a second contact metal.

2. The method of claim 1, wherein the active layer is a light emitting film comprising a Group III nitride material, or a multiple quantum well.

3. The method of claim 1, wherein the first contact layer is an n-contact layer comprising a Group III nitride material doped with n-type dopants, and wherein the second contact layer is a p-contact layer comprising a Group III nitride material doped with p-type dopants.

4. The method of claim 3, wherein the n-type dopants comprise Si, P, As, or Sb, and wherein the p-type dopants comprise Mg, B, Al, or In.

5. The method of claim 3, wherein the first electrically conductive layer comprises ITO, ZnO, or Ti/Au.

6. The method of claim 3, wherein the second electrically conductive layer comprises Au, Ni, Pt, Pd, Ti, W, Cr/Au, Ni/Au, Au/NiO, Pt/Au, Pd/Au, Co/Au, Cu/Au, Ni/Pt, Ni/Au/Zn, Cr/Au/Zn, Ni/Cr/Au, Ni/Pt/Au, Pt/Ni/Au, Pd/Pt/Au, Ti/Al/Ni/Au, or Ni/Au/Ti/Al/Au.

7. The method of claim 1, wherein the first contact layer is a p-contact layer comprising a Group III nitride material doped with p-type dopants, and wherein the second contact layer is an n-contact layer comprising a Group III nitride material doped with n-type dopants.

8. The method of claim 7, wherein the p-type dopants comprise Mg, B, Al, or In, and wherein the n-type dopants comprise Si, P, As, or Sb.

9. The method of claim 7, wherein the first electrically conductive layer comprises Au, Ni, Pt, Pd, Ti, W, Cr/Au, Ni/Au, Au/NiO, Pt/Au, Pd/Au, Co/Au, Cu/Au, Ni/Pt, Ni/Au/Zn, Cr/Au/Zn, Ni/Cr/Au, Ni/Pt/Au, Pt/Ni/Au, Pd/Pt/Au, or Ti/Al/Ni/Au.

10. The method of claim 7, wherein the second electrically conductive layer comprises ITO, ZnO, or Ti/Au.

11. The method of claim 1, wherein the passivation layer comprises $SiO_2$, SiN, or $Al_2O_3$.

12. The method of claim 1, wherein the first contact metal comprises Ti/Au, Ti/Al/Au, or Ti/Ag/Au, and wherein the second contact metal comprises but not limited to, Ti/Au, Ti/Al, or Ti/Ag/Al.

13. The method of claim 1, further comprising a buffer layer disposed between the LED stack and the base substrate, wherein the buffer layer comprises AlN, GaN, or AlGaN.

14. The method of claim 1, wherein said removing the LED stack from the base substrate comprises:
- forming one or more stressor layers on an uppermost surface of the LED stack, opposite the base substrate;
- forming a handle layer on the one or more stress layers; and
- applying force to the handle layer so as to separate the one or more stress layers and the LED stack from the base substrate along a spalling plane within the first contact layer.

15. The method of claim 14, wherein the one or more stress layers comprise a metal, a polymer, or a combination thereof.

16. The method of claim 14, wherein the handle layer comprises a metal or a polyimide.

17. The method of claim 14, wherein a thickness of the one or more stressor layers is selected so as to exfoliate the LED stack from the base substrate at the spalling plane.

18. The method of claim 14, further comprising removing the one or more stressor layers and the handle layer from the uppermost surface of the LED stack.

19. The method of claim 1, wherein removing the LED stack from the base substrate comprises:
- forming a sacrificial layer between the LED stack and the base substrate; and
- etching the sacrificial layer selectively with respect to the base substrate and the first contact layer of the LED stack.

20. The method of claim 19, wherein the sacrificial layer comprises GaN:Si, CrN or ZnO.

* * * * *